(12) United States Patent
Wan

(10) Patent No.: US 10,587,228 B2
(45) Date of Patent: Mar. 10, 2020

(54) COMMON MODE REJECTION INCLUDING TEMPERATURE DRIFT CORRECTION

(71) Applicant: Analog Devices, Inc., Norwood, MA (US)

(72) Inventor: Quan Wan, Belmont, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 16/034,071

(22) Filed: Jul. 12, 2018

(65) Prior Publication Data

US 2020/0021248 A1 Jan. 16, 2020

(51) Int. Cl.
  *H03F 1/30* (2006.01)
  *H03F 3/45* (2006.01)
  *H03F 1/02* (2006.01)

(52) U.S. Cl.
  CPC ........... *H03F 1/30* (2013.01); *H03F 3/45968* (2013.01); *H03F 2200/375* (2013.01); *H03F 2200/447* (2013.01); *H03F 2203/45212* (2013.01); *H03F 2203/45588* (2013.01)

(58) Field of Classification Search
  USPC ..................................... 330/252–261, 289, 9
  See application file for complete search history.

(56) References Cited

U.S. PATENT DOCUMENTS

| | | | |
|---|---|---|---|
| 4,464,631 A | 8/1984 | Prentice | |
| 5,200,654 A | 4/1993 | Archer | |
| 6,194,962 B1* | 2/2001 | Chen | H03F 3/4521 |
| | | | 330/253 |
| 7,049,889 B2* | 5/2006 | Kalb | H03F 1/301 |
| | | | 330/253 |

OTHER PUBLICATIONS

"AD8410 High Voltage, High Bandwidth, Current Sense Amplifier Preliminary Data Sheet", www.analog.com, (Sep. 14, 2016), 4 pages.
"AD8418A Bidirectional, Zero Drift, Current Sense Amplifier", www.analog.com, (May 22, 2018), 17 pages.

* cited by examiner

*Primary Examiner* — Hieu P Nguyen
(74) *Attorney, Agent, or Firm* — Schwegman Lundberg & Woessner, P.A.

(57) ABSTRACT

An amplifier circuit can have a differential input. A common-mode signal present at the differential input can induce an offset voltage at an output of the amplifier circuit. A compensation can be performed to reduce or eliminate such an offset, such as at a first temperature. Circuits and techniques for drift correction can be performed, such as to correct for residual offset error across an entirety of a specified operation temperature range. In an example, first and second drift correction signal generator circuits can be used, such as to provide signals proportional to a common mode voltage, but having different temperature coefficients.

20 Claims, 8 Drawing Sheets

COMMON MODE REJECTION INCLUDING TEMPERATURE DRIFT CORRECTION

FIELD OF THE DISCLOSURE

This document pertains generally, but not by way of limitation, to amplifier circuits and related techniques, and more particularly, to circuits and techniques for reducing or eliminating an offset error at an output of an amplifier circuit, over a specified range of temperatures, such as an offset error induced by a common-mode voltage at an input of the amplifier circuit.

BACKGROUND

An amplifier circuit can have a differential input, such as including a positive input terminal and a negative input terminal. Classes of amplifier circuits having differential inputs can include difference amplifiers, instrumentation amplifiers, and operational amplifiers, as illustrative examples. A voltage common to both the positive input terminal and the negative input terminal can be referred to as a "common mode" voltage. Generally, the amplifier circuit is arranged to reject such a common-mode voltage and to amplify a difference in voltage between the positive and negative input terminals. Such amplifier circuits generally have a finite common-mode rejection capability. Accordingly, an offset in the amplifier circuit output can appear in response to a common mode voltage at the differential input. A ratio of a magnitude of an output voltage offset to a magnitude of a common mode voltage at the amplifier circuit input is generally referred to as a common mode rejection ratio (CMRR). CMRR can be specified in terms of logarithmic units (e.g., decibels).

SUMMARY OF THE DISCLOSURE

Amplifier circuits having differential inputs can be used in a variety of applications. For example, an electrical current can be sensed using a difference amplifier circuit, such as for purposes of monitoring, protection, or control of a load device. Such current sensing can be performed in relation to single-phase or multi-phase loads. Generally, a sensing resistor can be placed in-line with such a power supply and a load. In a multi-phase system, current sensing elements can be placed in-line with the power supply and loads corresponding to each phase. A current flowing through the power supply and a corresponding load can be determined such as by amplifying and measuring a differential signal representative of a voltage drop produced by the sensing device. An output of such amplification can be used for purposes of monitoring, protection, or control of a load device.

In a current sensing application, a common mode voltage at an amplifier input can change dramatically over operating conditions, such as periodically in response to switching events. The common mode voltage can induce an offset voltage at an amplifier circuit output. In applications where relatively higher precision is demanded, a total error budget can be specified over a specified range of operating temperatures. In one approach, a compensation can be performed at one temperature such as to reduce or eliminate the offset voltage at an amplifier circuit output due to the common mode voltage at the amplifier input. However, such an offset compensation technique may not be immune to drift effects. The present inventor has recognized, among other things, that a temperature drift correction scheme can be used, such as in combination with an initial offset compensation, to ensure that an output offset is within a specified error budget across the specified operating temperature range.

In an example, an amplifier circuit can have a differential input. A common-mode signal present at the differential input can induce an offset voltage at an output of the amplifier circuit. A compensation can be performed to reduce or eliminate such an offset, such as at a first temperature. Circuits and techniques for drift compensation can be performed, such as to correct for residual offset error across an entirety of a specified operation temperature range. In an example, first and second drift correction signal generator circuits can be used, such as to provide signals proportional to a common mode voltage, but having different temperature coefficients.

In an example, an electronic circuit can provide output voltage offset compensation including correction for drift across an operating temperature range, the electronic circuit including an amplifier circuit comprising a differential input, a first drift correction signal generator configured to provide a first drift correction signal proportional to a common mode input signal provided to the amplifier circuit, the first error correction signal having a first temperature coefficient, a second drift correction signal generator configured to provide a second drift correction signal proportional to the common mode input signal, the second error correction signal having a different second temperature coefficient, and an injection circuit to couple the first and second drift correction signals to the amplifier circuit to provide the output voltage offset compensation.

In an example, a technique, such as a method, can generating a first drift correction signal for injection into the amplifier, the first drift correction proportional to a common mode input signal provided to an amplifier, the first drift correction signal having a first temperature coefficient, and the first drift correction signal scaled according to a scaling value, and generating a second drift correction signal for injection into the amplifier, the second drift correction proportional to the common mode input signal, the second drift correction signal having a different second temperature coefficient, and the second drift correction signal scaled according to the scaling value. The method can perform compensation to reduce or suppress an offset voltage at an output of an amplifier across a range of temperatures.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As mentioned above, various techniques can be used to reduce or eliminate an offset voltage induced at an amplifier circuit output in response to a common mode signal at an input to the amplifier circuit. In one approach, a compensation can be performed at one temperature such as to reduce or eliminate an offset voltage at an amplifier circuit output due to a common mode voltage at the amplifier input. However, such an offset compensation technique may not be immune to drift effects.

The present inventor has recognized, among other things, that a temperature drift correction scheme can be used, such as in combination with an offset compensation, to ensure that an output offset is within a specified error budget across the specified operating temperature range. A drift compensation scheme can include use of two drift correction signals that are generated in proportion to a common mode input signal. The two drift correction signals can have different temperature coefficients. Various examples are described herein, including use of an injection circuit to selectively apply the drift correction signals to the amplifier circuit, such as by summing the drift correction signals and injecting them at a differential input to the amplifier circuit.

Figure 1A:
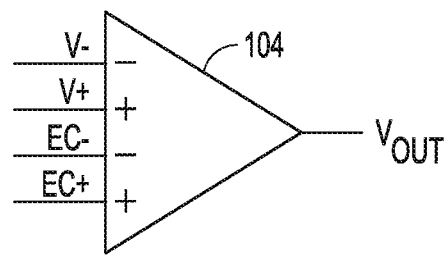
FIG. 1A illustrates generally an example comprising an electronic circuit, such as including an amplifier circuit comprising inputs to receive signals from drift correction signal generation circuitry.
Figure 1B:
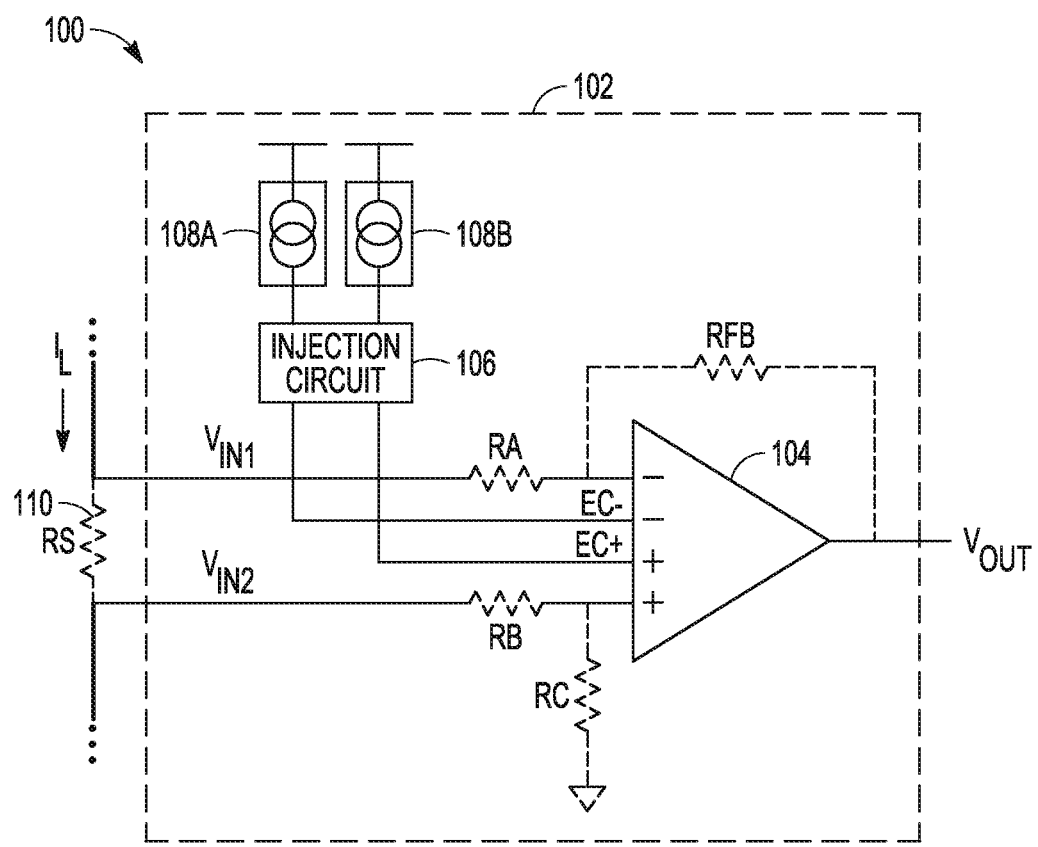
FIG. 1B illustrates generally an example comprising an electronic circuit, such as including an amplifier circuit, and drift correction signal generation circuitry.

FIG. 1A illustrates generally an example comprising an electronic circuit, such as including an amplifier circuit 104 comprising signal inputs (V+; V−) along with error correction inputs (EC+; EC−), where the error correction inputs receive signals from drift correction signal generation circuitry. In this manner, an output voltage offset at VOUT can be corrected across a specified range of temperatures, such as using a combination of an offset compensation performed at a first temperature, and a drift correction to provide correction as temperature varies. FIG. 1B illustrates generally an example comprising an electronic circuit 100, such as including an amplifier circuit 104, and drift correction signal generation circuitry comprising a first drift correction signal generator 108A and a second drift correction signal generator 108B. The signal generators 108A and 108B can include outputs fed into an injection circuit 106. A portion or an entirety of the electronic circuit 100 can be implemented monolithically as an integrated circuit, or can be packaged within an integrated circuit device package (such as including elements within the region 102), to provide an integrated assembly including drift correction circuitry.

As an illustrative example, the electronic circuit 100 of FIG. 1B can provide a current sensing configuration where a current IL flowing through a load induces a voltage across a sense resistor 110, RS, and the amplifier circuit 104 is arranged with resistor RA, RB, RC, and RFB to provide an output voltage VOUT proportional to the current through the sense resistor RS. In an illustrative example involving a 48V H-bridge motor control system, an input common mode voltage imposed at $V_{IN1}$ and $V_{IN2}$ can include a pulse width modulation (PWM) waveform having a low level of −2V and high level of 48V relative to a reference potential (e.g., "GROUND"). In this illustrative example, assuming that a common mode rejection ratio (CMRR) is about 90 dB and offset is nulled at 0V, then an offset voltage referred back to the amplifier input can span 1.5 millivolts (mV) when the common mode voltage toggles between −2V and 48V. In the illustrative example of FIG. 1B, a significant proportion of a common-mode-dependent offset can be caused by mismatch of the values of resistors RA, RB, RC, and RFB, or devices mismatch inside the amplifier circuit 104 (such as where the amplifier circuit 104 is an operational amplifier). In generally-available devices, an offset compensation or "trim" can be performed to improve CMRR, such as at a single temperature.

Even if a single-temperature trim is performed, CMRR can drift with temperature for one or more of the following reasons: parasitic resistance such as due to conductive traces not matching precisely, leading to resistance ratio change with temperature; package stress changes with temperature, such as leading to resistance ratio change with temperature; mismatching of circuits or individual devices inside the amplifier circuit, such as may change with temperature or common mode input voltage due to effects of package stress or process variation. Such examples are illustrative and not exhaustive of effects that can cause unwanted drift in common mode rejection performance, even if a single-temperature compensation has been performed.

Figure 2A:
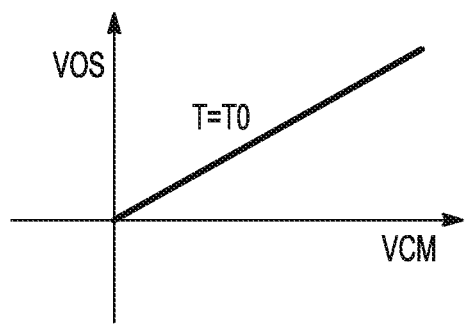
FIG. 2A, FIG. 2B, FIG. 2C, and FIG. 2D show various illustrative examples depicting a polarity and trend of an output voltage offset (VOS) as a function of an input common mode voltage (VCM) in various scenarios.
Figure 2B:
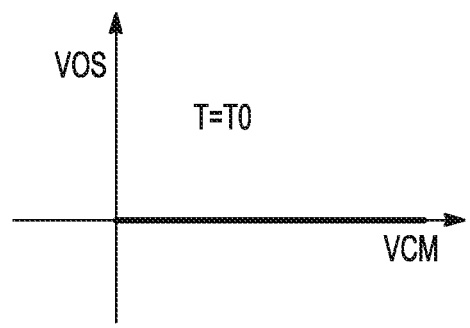
Figure 2C:
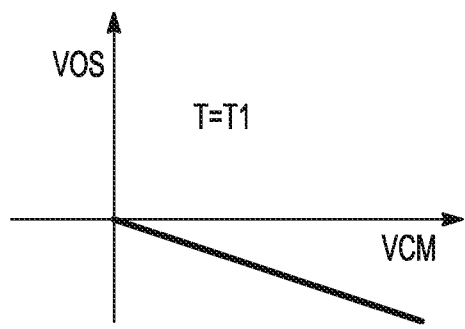
Figure 2D:
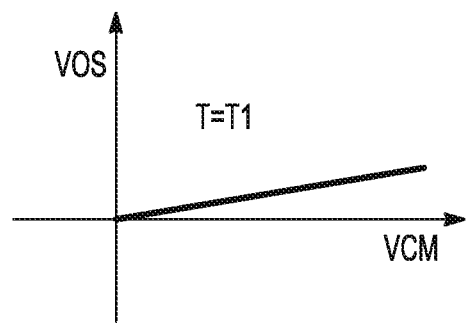

FIG. 2A, FIG. 2B, FIG. 2C, and FIG. 2D show various illustrative examples depicting a polarity and trend of an output voltage offset (VOS) as a function of an input common mode voltage (VCM) in various scenarios. For example, FIG. 2A illustrates an offset voltage versus input common mode voltage before CMRR compensation. In FIG. 2A, VOS at VCM=0 has been nulled out, but VOS still exhibits variation with respect to common mode voltage magnitude, even at a single temperature T=T0. In FIG. 2B, CMRR has been trimmed at a single temperature, and the CMRR at T=T0 has been greatly improved after trimming. FIG. 2C and FIG. 2D illustrate that a slope and a polarity of VOS can vary from one amplifier circuit to another (e.g., from "part" to "part"), and that CMRR can degrade significantly at temperatures other than T=T0. For example, FIG. 2C and FIG. 2D illustrate VOS at T=T1, such as representing a second temperature. T0 can refer to a lower temperature limit defining a specified operating temperature range, and T1 can refer to an upper temperature limit defining the specified operating temperature range. In an illustrative example, for applications where a relatively high operating precision is desired, the specified temperature range can span from about −40 C to about 150 C (such as for an automotive application).

Figure 3:
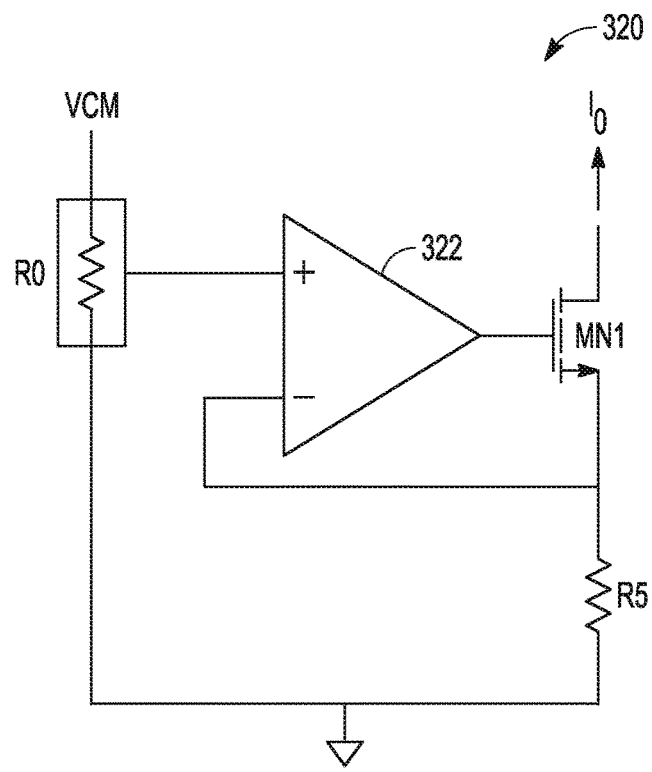
FIG. 3 illustrates generally an example comprising an electronic circuit, such as can be used for performing a common mode voltage offset compensation using an adjustable element to generate an offset compensation signal.

FIG. 3 illustrates generally an example comprising an electronic circuit 320, such as can be used for performing a common mode voltage offset compensation using an adjustable element (e.g., a resistor divider or potentiometer R0) to sense a common mode input voltage and to generate an offset compensation signal $I_0$. In the example of FIG. 3, a common mode input voltage can be provided (node VCM). A ratio of resistances forming the potentiometer R0 structure can be adjusted (e.g., trimmed) or a tap point of the potentiometer R0 can be moved such as to make $I_0$ proportional to VCM (at least at the temperature where the adjustment is performed, e.g., T=T0) using an amplifier 322, output transistor MN1 and resistor R5. In this manner, compensation can be provided for an offset voltage VOS as shown in FIG. 2A to provide the improved performance shown in FIG. 2B (e.g., having VOS reduced or eliminated at T=T0). But, as shown in FIG. 2C and FIG. 2D, adjusting R0 at T=T0 can fail to account for a temperature-induced drift in common mode rejection performance.

Figure 4:
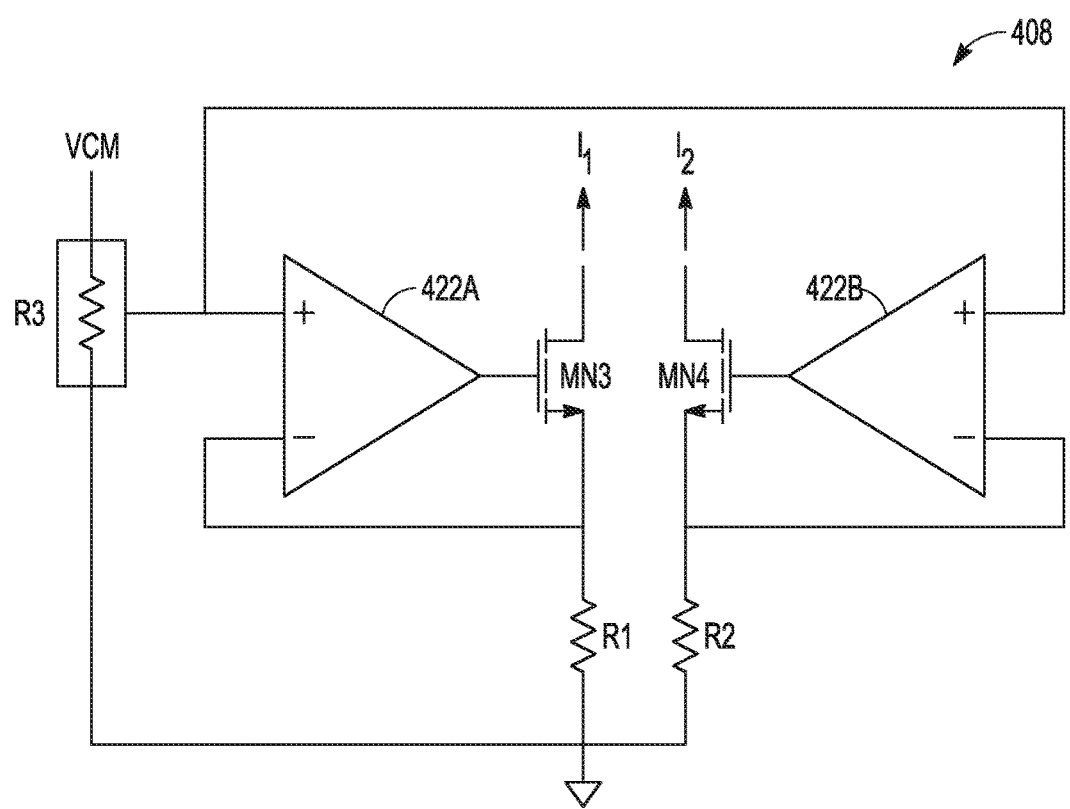
FIG. 4 illustrates generally an example comprising an electronic circuit, such as can be used for performing a common mode voltage drift correction, including generating first and second drift correction signals proportional to a common mode input signal.
Figure 5:
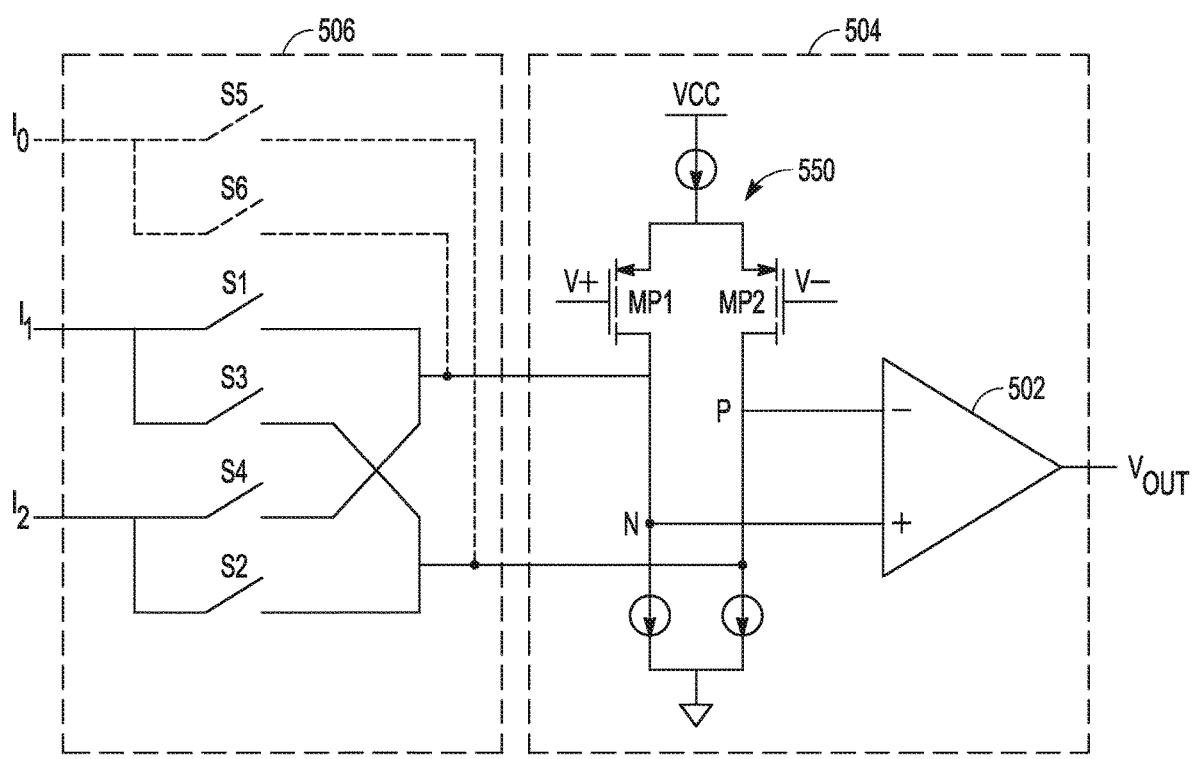
FIG. 5 illustrates generally an example comprising an electronic circuit, such as including an amplifier circuit, and an injection circuit.

FIG. 4 illustrates generally an example comprising an electronic circuit 408, such as can be used for performing a common mode voltage drift correction, including generating first and second drift correction signals $I_1$ and $I_2$, proportional to a common mode input signal, VCM. Like the example of FIG. 3, a resistor network R3 can be adjusted (such as by varying a ratio of resistors forming R3 or by moving a tap location along R3), such as to scale $I_1$ and $I_2$ in proportion to VCM by sensing and providing a voltage value proportional to VCM to each of the amplifiers 422A and 422B. In FIG. 4, impedance elements such as resistors R1 and R2 can be used to vary $I_1$ and $I_2$ across temperature. For example, R1 and R2 can have different temperature coefficients (e.g., R1 can provide a first temperature coefficient, TC1, and R2 can provide a different second temperature coefficient, TC2). At least one of R1 or R2 can be adjustable, such as trimmable, so that the resistance values match at a specified temperature. As an illustrative example, R1 and R2 can be different types of resistors (e.g., resistors having different physical composition). At least one of R1 or R2 can be physically trimmed via laser trim to match at T=T0. In another example, at least one of R1 or R2 can be a digitally-controllable potentiometer or variable resistor, such as to provide a digital "trim" capability, such as after packaging. In this manner, $I_1$ and $I_2$ can be established to compensate for a residual temperature-dependent offset voltage at an amplifier circuit output due to VCM. As an illustrative example, referring back to FIG. 3, the offset compensation signal $I_0$ can itself have a temperature dependent variation, $\Delta I_0$, and the drift correction signals $I_1$ and $I_2$ generated as shown in FIG. 4 can be selectively added or subtracted from an amplifier circuit input to compensates for AIe, such as shown in FIG. 5, using an injection circuit. In the example of FIG. 4, the electronic circuit 408 generates error correction signals having dependence on both a common mode component of an input signal (e.g., a common mode voltage magnitude) and temperature, and such a circuit 408 can be used to correct both the common mode signal dependent error and temperature dependent error. Other techniques can be used. For example, error correction signals such as a drift correction currents, can be generated using other circuitry, such as using a multiplier to aggregate two input signals: a common mode signal (e.g., VCM) and a Proportional-To-Absolute-Temperature (PTAT) voltage or Complementary-To-Absolute-Temperature (CTAT) voltage.

FIG. 5 illustrates generally an example comprising an electronic circuit, such as including an amplifier circuit 504 including an input differential pair 550 and a difference amplifier 502, and an injection circuit 506. As mentioned above, $I_0$ can be established using a trim procedure or other technique, such as T=T0, and $I_0$ can be injected into the amplifier circuit 504 input, such as having a selectable polarity using switches S5 and S6 (e.g., with S5 closed and S6 opened, or S5 opened and S6 closed), depending on a slope of a temperature-depended output offset voltage at VOUT induced by a common mode voltage at inputs "V+" and "V−" of the amplifier circuit 504 differential pair 550 (MP1, MP2). Similarly, depending on the polarity of the common-mode voltage induced drift across temperature, switches S1, S2, S3, and S4 can be used to select a polarity for injection of $I_1$ and $I_2$. For example, a first polarity can be selected when S1 and S2 are closed, and S3 and S4 are opened. An opposite second polarity can be selected which S1 and S2 or opened, and S3 and S4 are closed.

Figure 6:
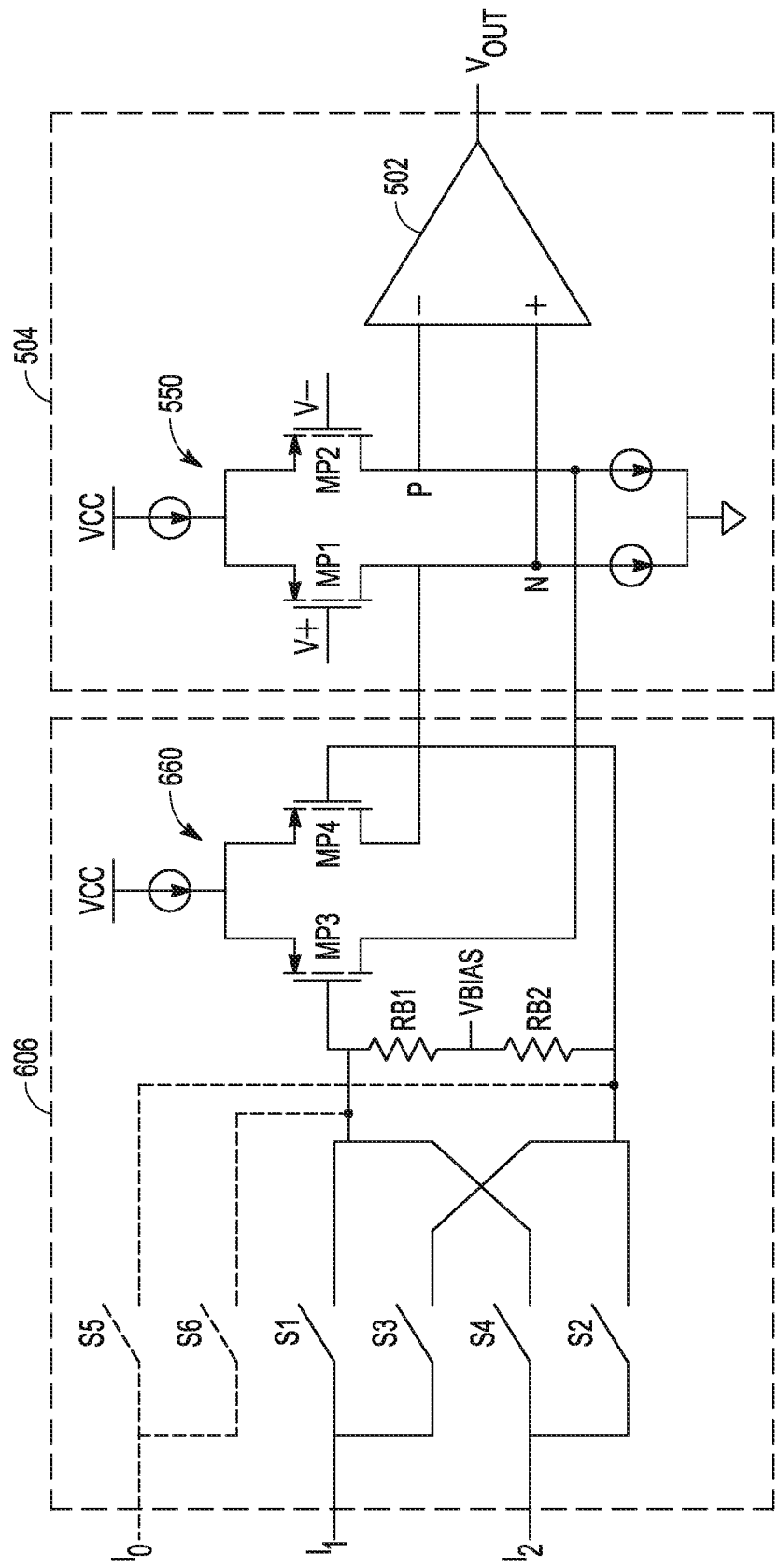
FIG. 6 illustrates generally another example comprising an electronic circuit, such as including an amplifier circuit, and an injection circuit.

FIG. 6 illustrates generally another example comprising an electronic circuit, such as including an amplifier circuit 504, and an injection circuit 606. As in FIG. 5, in FIG. 6, switches S1, S2, S3, and S4 can be used to select a polarity for application of drift correction signals $I_1$ and $I_2$, and switches S5 and S6 can be used to select a polarity for application of the compensation signal 10. By contrast with FIG. 5, in FIG. 6, a differential input stage 660 can be included comprising transistors MP3, MP4, and such as biased using RB1, RB2, and a bias voltage, VBIAS. The amplifier circuit 504 of FIG. 6 can receive a balanced, summed representation of $I_0$, $I_1$, and $I_2$ from the injection circuit 606 (which can be referred to as a "summing circuit"), and the summed representation of $I_0$, $I_1$, and $I_2$ can be combined with the input signal (e.g., a voltage developed across V+ and V− of the amplifier circuit 504 input pair 550), to provide temperature compensation including drift correction across temperature. In this manner, the input to the difference amplifier 502 can be adjusted to reduce or minimize an unwanted offset voltage at VOUT due to a common mode voltage present at V+ and V−.

Generally, switches shown in FIG. 5 and FIG. 6 can be implemented as transistor-based (e.g., electronic) switches or as mechanical switches. In an example, the switch structures can include fuse structures that can be permanently open-circuited or "blown" during fabrication or via an electronic command, such as during manufacturing test, after packaging, or in the field, as illustrative examples. In another example, a memory circuit or other storage device can be used, such as to store digital bits logically indicative of desired switch states, so that a corresponding switch configuration can be established from memory, such as after a calibration operation has been performed to establish such digital bit values. FIG. 5 or FIG. 6 can be used in combination with FIG. 3 and FIG. 4, to provide an amplifier configuration (such as for a difference amplifier application, operational amplifier, or other amplifier circuit having a differential input) including compensation at a first temperature (e.g., using the circuit of FIG. 3), along with providing drift correction (e.g., using the circuit of FIG. 4) across a specified operating temperature range up to and including a second temperature. An injection circuit as shown in either FIG. 5 or FIG. 6, can be used to apply $I_0$, $I_1$, and $I_2$ to an amplifier circuit input to reduce or eliminate an offset voltage at the VOUT node due to a common mode voltage imposed at the input nodes V+ and V− of the amplifier circuit.

Figure 7:
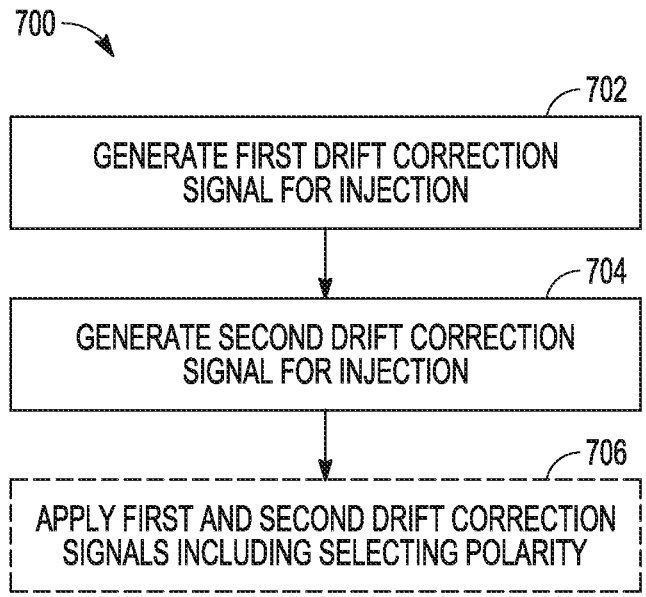
FIG. 7 illustrates generally a technique (e.g., a method) for generating first and second drift correction signals, such as using one or more circuits and techniques as described elsewhere herein.

FIG. 7 illustrates generally a technique 700 (e.g., a method) for generating first and second drift correction signals, such as using one or more circuits and techniques as described elsewhere herein. At 702, a first drift correction signal (e.g., I1) can be generated, such as for injection at an input to an amplifier circuit. At 704, a second drift correction signal can be generated, such as for injection at the input of the amplifier circuit. Optionally, at 706, the first and second drift correction signals can be applied to the input including selecting or using a specified polarity (e.g., depending on a sign of a slope of a temperature-related drift of an output offset voltage as a function of an input common mode voltage, such as after initial compensation). The first and second drift correction signals can be generated using elements having different temperature coefficients, as mentioned above in relation to the example of FIG. 4, as an illustration.

Figure 8:
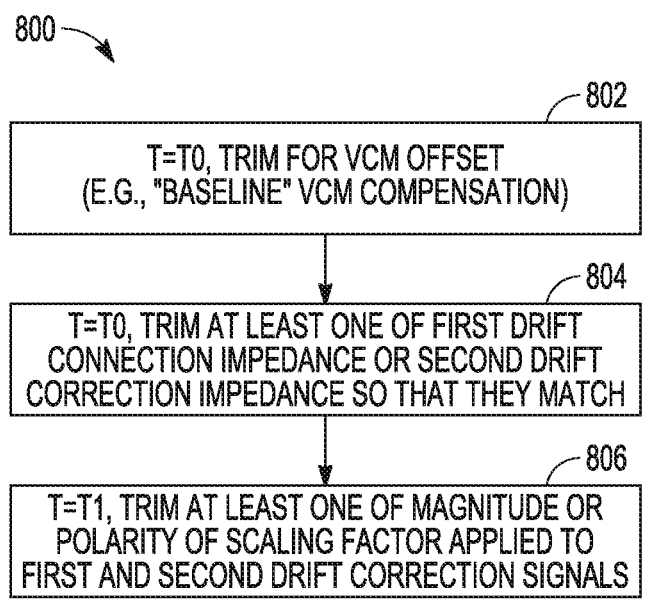
FIG. 8 illustrates generally a technique (e.g., a method) for performing various trim operations across a specified range of temperatures, such as using one or more circuits and techniques as described elsewhere herein.

FIG. 8 illustrates generally a technique 800 (e.g., a method) for performing various trim operations across a specified range of temperatures, such as using one or more circuits and techniques as described elsewhere herein. At 802, such as at a first temperature T=T0, a first trim operation can be performed such as to reduce or eliminate an offset voltage at an output of an amplifier circuit when a common mode voltage is imposed at the amplifier circuit input. For example, referring back to FIG. 3, and to FIG. 5 or FIG. 6, a slope of the output voltage offset, VOS, can be determined, and either switch S5 or S6 can be closed. The potentiometer R0 (see, e.g., FIG. 3) can be adjusted to vary $I_0$ until the output voltage offset, VOS, is reduced or eliminated. At 804, at least one of a first drift correction impedance or a second drift correction impedance can be adjusted so they match, such as T=T0. For example, adjustable impedances, such as R1 and R2 shown in FIG. 4, can be adjusted so that they match at T=T0. R1 and R2 can be used to generate first and second drift correction signals, $I_1$ and $I_2$, respectively.

At 806, at least one of a polarity or a magnitude of a scaling factor can be adjusted as used for application of first and second drift correction signals (e.g., $I_1$ and $I_2$). For example, referring back to FIG. 5 or FIG. 6, states of switches S1, S2, S3, and S4 can be established using information about a slope of a residual output offset voltage of an amplifier circuit, as a function of an input common mode voltage, at T=T1. After a polarity is selected (by closing switches S1, S2 or S3, S4), then, referring back to FIG. 4, R3 can be adjusted (e.g., a tap or ratio of resistances, as illustrative examples) to reduce or minimize an output offset voltage at T=T1. In this manner, using the technique 800, an output offset voltage can be reduced or eliminated across a specified operating temperature range, such as defined by T0 and T1. As an illustrative example, T0=−40 C and T1=150 C. Other ranges can be used, and the values T0 and T1 need not define an entirety of a specified operating temperature range of an amplifier circuit.

Figure 9A:
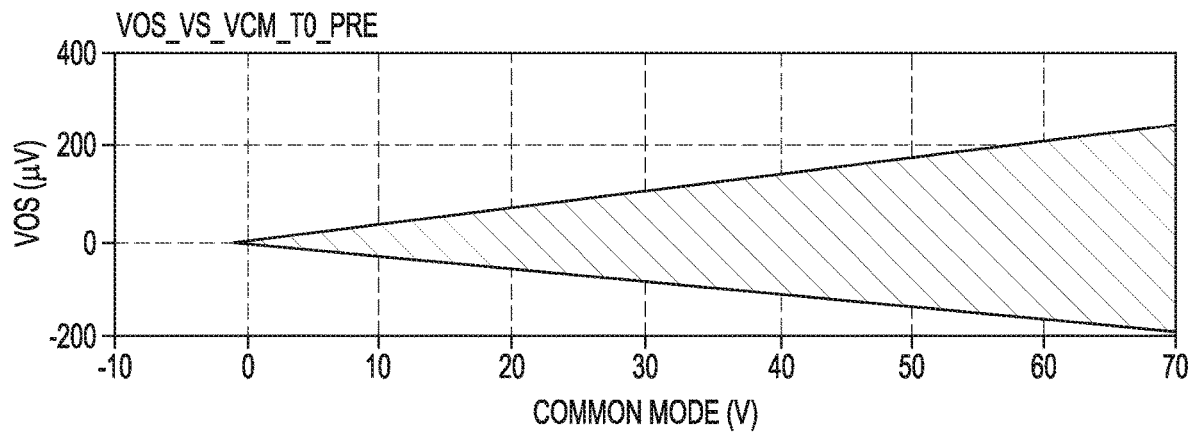
FIG. 9A, FIG. 9B, FIG. 9C, FIG. 9D, FIG. 9E, and FIG. 9F show various illustrative examples depicting simulation results corresponding to the circuits of FIG. 3, FIG. 4, and FIG. 6, in various scenarios.
Figure 9B:
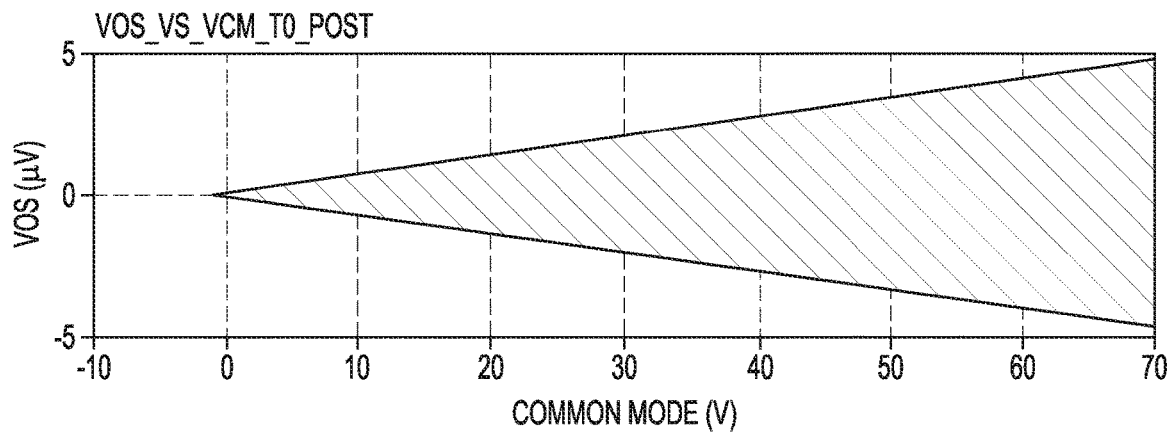
Figure 9C:
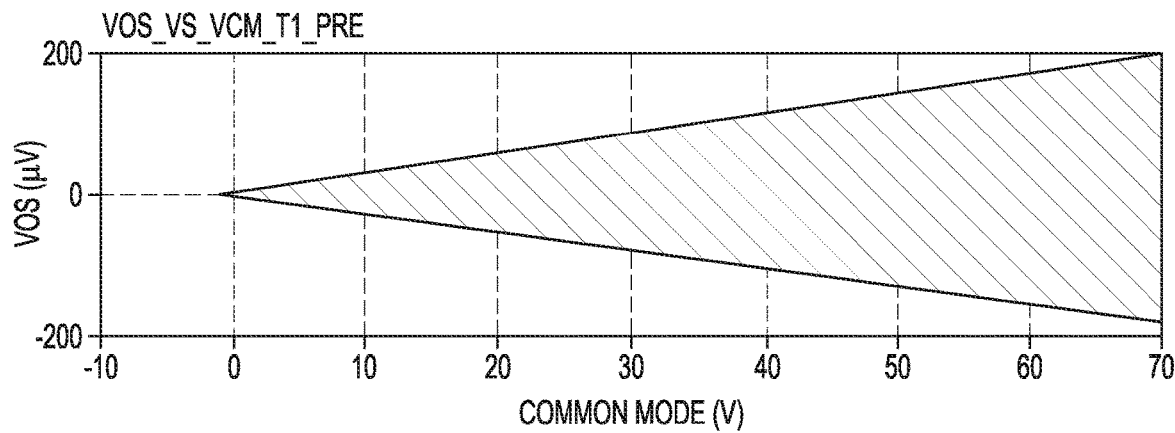

FIG. 9A, FIG. 9B, FIG. 9C, FIG. 9D, FIG. 9E, and FIG. 9F show various illustrative examples depicting simulation results corresponding to the circuits of FIG. 3, FIG. 4, and FIG. 6, in various scenarios. The simulation results represent a Monte Carlo simulation performed using 1000 trials, where common-mode-rejection-related drift is modeled with random parasitic resistance mismatching due to interconnect conductivity variation (e.g., metal trace variation). For purposes of simulation, output voltage offset and offset drift at 0V VCM has been trimmed or removed, so the resulting simulated VOS values correspond to VCM values other than 0V. FIG. 9A illustrates VOS versus VCM at −40 C before trim (e.g., before compensation using, e.g., the circuit of FIG. 3 at T=T0=−40 C). FIG. 9B illustrates VOS versus VCM after compensation, such as after adjusting R0 as shown in FIG. 3 to minimize VOS. In FIG. 9B, CMRR is greater than 140 dB at −40 C. FIG. 9C illustrates VOS versus VCM at 150 C before drift correction has been established. Although the minimum CMRR of the amplifier circuit has been trimmed to be greater than 140 dB at −40 C as shown in FIG. 9B, in FIG. 9C, CMRR has dropped to about 110 dB after temperature rise to 150 C because CMRR exhibits a drift behavior with respect to temperature.

Figure 9D:
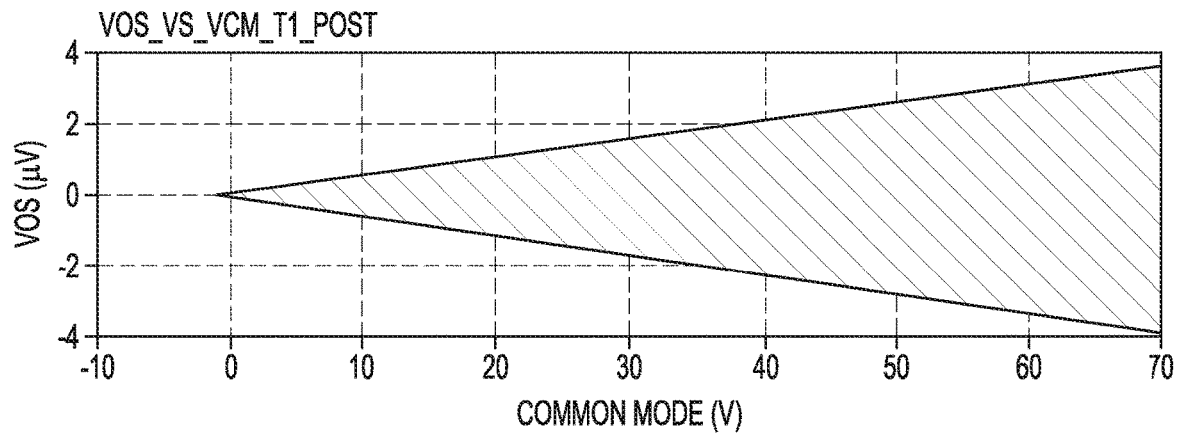
Figure 9E:
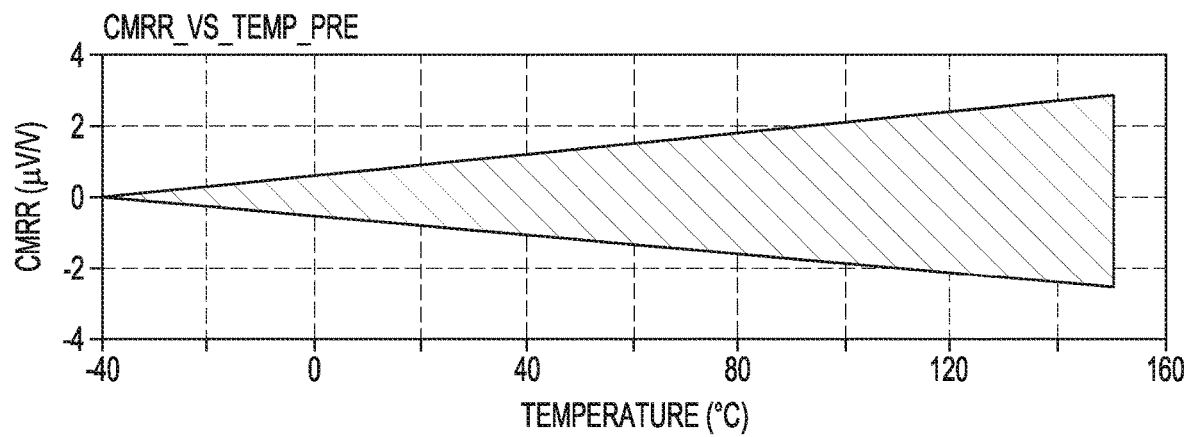
Figure 9F:
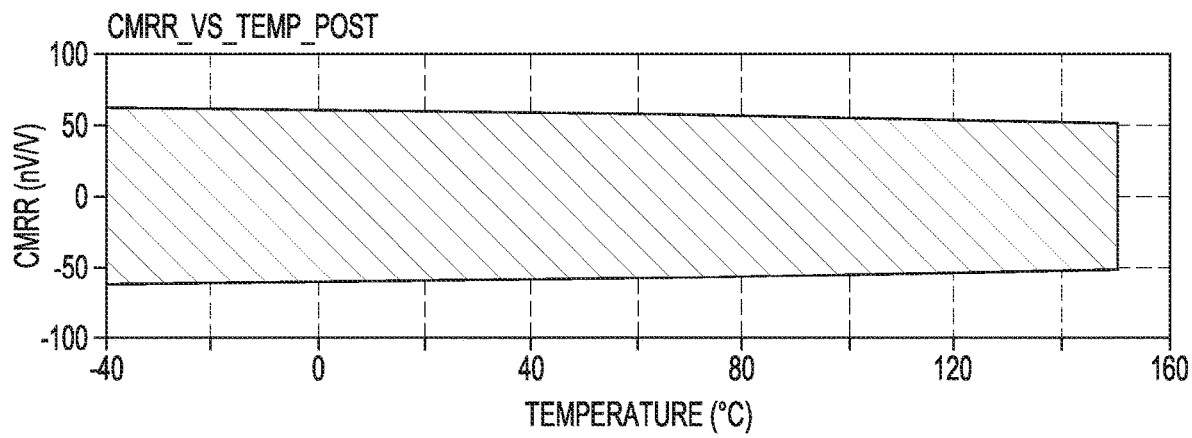

FIG. 9D illustrates VOS versus VCM at T=T1=150 C, after performing a trim to compensate for drift behavior. For example, referring to FIGS. 4, R1 and R2 can be matched at T=T0, and at T=T1, R3 can be adjusted, and again CMRR performance can be restored to 140 dB. FIG. 9E illustrates CMRR (in microvolts per volt) versus temperature before drift correction is implemented, and FIG. 9F illustrates CMRR versus temperature after drift correction. Accordingly, the simulation results shown in FIGS. 9E and 9F illustrate that a sixty-fold reduction in CMRR drift has been achieved in this illustrative example.

In the examples described in this document, use of the phrase "trim" need not require literal trimming of impedance elements. An impedance element such as a resistor can be adjusted using various techniques such as laser trim or mechanical trim of resistor devices (e.g., film resistors), biasing of active load devices, use of a potentiometer, or use of digital techniques (e.g., involving transistor or physical switches or fuses to selectively isolate or connect circuit elements in a resistor network), to provide an adjustable resistance, as illustrative examples.

VARIOUS NOTES

Each of the non-limiting aspects described in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic circuit to provide output voltage offset compensation including correction for drift across an operating temperature range, the electronic circuit comprising:
   an amplifier circuit comprising a differential input;
   a first drift correction signal generator configured to provide a first drift correction signal proportional to a common mode input signal provided to the amplifier circuit, the first error correction signal having a first temperature coefficient;
   a second drift correction signal generator configured to provide a second drift correction signal proportional to the common mode input signal, the second error correction signal having a different second temperature coefficient; and
   an injection circuit to couple the first and second drift correction signals to the amplifier circuit to provide the output voltage offset compensation;
   wherein the injection circuit is configured to apply representations of the first and second drift correction signals having a specified polarity selectable in response to a slope of an output offset voltage versus the common mode input signal.

2. The electronic circuit of claim 1, comprising a scaling circuit configured to scale the first and second drift correction signals in proportion to the common mode input signal.

3. The electronic circuit of claim 1, wherein the injection circuit includes switches to establish the specified polarity.

4. The electronic circuit of claim 1, wherein the injection circuit comprises a summing circuit configured to apply the representations of the first and second drift correction signals to the differential input of the amplifier circuit.

5. The electronic circuit of claim 1, wherein the first drift correction signal generator includes a first impedance used to generate the first drift correction signal and the second drift correction signal generator includes a second impedance used to generate the second drift correction signal.

6. The electronic circuit of claim 5, comprising a common mode offset compensation signal generator configured to provide a first compensation signal to reduce or suppress a first output offset voltage corresponding to a first temperature.

7. The electronic circuit of claim 6, wherein at least one of the first impedance or the second impedance is adjustable so that the first and second impedances match.

8. The electronic circuit of claim 7, wherein the specified temperature is the first temperature.

9. The electronic circuit of claim 8, comprising a scaling circuit configured to scale the first and second drift correction signals in proportion to the common mode input signal, the scaling circuit including an adjustable impedance to reduce or suppress a second output offset voltage corresponding to a second temperature, different from the first temperature.

10. The electronic circuit of claim 9, wherein the first and second temperatures define the operating temperature range.

11. The electronic circuit of claim 9, wherein the scaling circuit comprises a resistor divider, and wherein the first and second impedances comprise respective resistors.

12. A method for performing compensation to reduce or suppress an offset voltage at an output of an amplifier across a range of temperatures, the method comprising:
   generating a first drift correction signal for injection into the amplifier, the first drift correction proportional to a common mode input signal provided to the amplifier, the first drift correction signal having a first temperature coefficient, and the first drift correction signal scaled according to a scaling value; and
   generating a second drift correction signal for injection into the amplifier, the second drift correction proportional to the common mode input signal, the second drift correction signal having a different second temperature coefficient, and the second drift correction signal scaled according to the scaling value;
   wherein applying representations of the first and second drift correction signals includes selecting a polarity of application of the first and second drift correction signals in response to a slope of an offset voltage versus the common mode input signal.

13. The method of claim 12, wherein applying representations of the first and second drift correction signals includes selecting the polarity of application of the first and second drift correction signals using switches.

14. The method of claim 12, wherein establishing the first and second drift correction signals includes adjusting at least one of a first impedance or a second impedance so that the first and second impedances match, the first impedance used to generate the first drift correction signal, and the second impedance used to generate the second drift correction signal.

15. The method of claim 14, comprising generating a first compensation signal for injection into the amplifier, the first compensation signal established to reduce or suppress a first offset voltage corresponding to a first temperature.

16. The method of claim 15, wherein adjusting the first and second impedances includes performing such adjustment at a specified temperature.

17. The method of claim 16, wherein the specified temperature is the first temperature.

18. The method of claim 17, wherein the scaling value is established a different second temperature to reduce or suppress a second output offset voltage corresponding to the second temperature.

19. An electronic circuit to provide output voltage offset compensation including correction for drift across an operating temperature range, the electronic circuit comprising:
   a means for amplifying a signal provided at a differential input;
   a means for generating a first drift correction signal for injection into the amplifier, the first drift correction proportional to a common mode input signal provided to the amplifier, the first drift correction signal having a first temperature coefficient, and the first drift correction signal scaled according to a scaling value;
   a means for generating a second drift correction signal for injection into the amplifier, the second drift correction proportional to the common mode input signal, the second drift correction signal having a different second temperature coefficient, and the second drift correction signal scaled according to the scaling value; and
   a means for applying representations of the first and second drift correction signals including providing a selectable polarity of application of the first and second drift correction signals in response to a slope of an offset voltage versus the common mode input signal.

20. The electronic circuit of claim 19, wherein establishing the first and second drift correction signals includes a means for adjusting at least one of a first impedance or a second impedance so that the first and second impedances match at a first temperature, the first impedance used to generate the first drift correction signal, and the second impedance used to generate the second drift correction signal; and
   wherein a means for adjusting a third impedance is provided to establish the third impedance at a different second temperature to reduce or suppress a second output offset voltage corresponding to the second temperature.

* * * * *